(12) United States Patent
Yau et al.

(10) Patent No.: US 11,431,248 B2
(45) Date of Patent: Aug. 30, 2022

(54) HYSTERESIS VOLTAGE DETECTION CIRCUIT

(71) Applicant: ASIAN POWER DEVICES INC., Taoyuan (TW)

(72) Inventors: Yeu-Torng Yau, Taoyuan (TW); Tsung-Liang Hung, Taoyuan (TW)

(73) Assignee: ASIAN POWER DEVICES INC., Taoyuan (TW)

(*) Notice: Subject to any disclaimer, the term of this patent is extended or adjusted under 35 U.S.C. 154(b) by 117 days.

(21) Appl. No.: 17/027,052

(22) Filed: Sep. 21, 2020

(65) Prior Publication Data

US 2021/0384822 A1    Dec. 9, 2021

(30) Foreign Application Priority Data

Jun. 3, 2020 (TW) ................................. 109118590

(51) Int. Cl.
  *H02M 3/155* (2006.01)
  *H02M 1/00* (2006.01)
  *G01R 19/00* (2006.01)

(52) U.S. Cl.
  CPC ........ *H02M 3/155* (2013.01); *G01R 19/0084* (2013.01); *H02M 1/00* (2013.01); *H02M 1/0048* (2021.05)

(58) Field of Classification Search
  None
  See application file for complete search history.

(56) References Cited

U.S. PATENT DOCUMENTS

| 5,717,578 A * | 2/1998 | Afzal ................ H02M 3/33507 363/21.16 |
| 6,340,880 B1 * | 1/2002 | Higashijima ......... H02J 7/0031 320/136 |
| 6,445,144 B1 * | 9/2002 | Wuidart ................ H05B 39/02 315/71 |
| 6,977,485 B1 * | 12/2005 | Wei ......................... H02J 7/022 320/139 |
| 7,279,954 B2 * | 10/2007 | Throngnumchai ...... G01K 7/42 327/512 |

(Continued)

FOREIGN PATENT DOCUMENTS

| CN | 204858552 U | 12/2015 |
| CN | 209881490 U | 12/2019 |

(Continued)

*Primary Examiner* — Thienvu V Tran
*Assistant Examiner* — Nusrat Quddus
(74) *Attorney, Agent, or Firm* — Muncy, Geissler, Olds & Lowe, P.C.

(57) ABSTRACT

A hysteresis voltage detection circuit includes a voltage stabilizing unit, a first power switch, a first voltage dividing resister, a second voltage dividing resister, a third voltage dividing resistor and a second power switch. The voltage stabilizing unit is coupled to an adjustable voltage source. When both the first power switch and the second power switch are turned on, the first voltage dividing resistor, the second voltage dividing resistor, and the third voltage dividing resistor divide the adjustable voltage source. When both the first power switch and the second power switch are turned off, the first voltage dividing resistor and the second voltage dividing resistor divide the adjustable voltage source.

6 Claims, 3 Drawing Sheets

(56) References Cited

U.S. PATENT DOCUMENTS

| | | | | |
|---|---|---|---|---|
| 7,477,502 B1* | 1/2009 | Faulkner | ................ | H02H 3/033 |
| | | | | 361/93.7 |
| 8,193,775 B2* | 6/2012 | Park | ..................... | H03K 17/145 |
| | | | | 320/134 |
| 8,537,515 B2* | 9/2013 | Inoue | ...................... | H02M 1/08 |
| | | | | 361/91.1 |
| 10,168,720 B2* | 1/2019 | Iwata | ........................ | G05F 1/565 |
| 10,186,962 B2* | 1/2019 | Matsuura | .............. | H02M 3/335 |
| 10,670,639 B2* | 6/2020 | Nakajima | .......... | G03G 15/2003 |
| 2001/0015638 A1* | 8/2001 | Sugano | ................... | G05F 1/575 |
| | | | | 323/282 |
| 2004/0174206 A1* | 9/2004 | Matsumura | .............. | G05F 1/46 |
| | | | | 327/541 |
| 2005/0162207 A1* | 7/2005 | Kamei | ............... | H03K 3/02337 |
| | | | | 327/205 |
| 2006/0170403 A1* | 8/2006 | Im | .......................... | G05F 1/575 |
| | | | | 323/280 |
| 2011/0241624 A1* | 10/2011 | Park | ....................... | H03K 17/14 |
| | | | | 327/427 |
| 2012/0161743 A1* | 6/2012 | Chi | ........................... | G05F 3/02 |
| | | | | 323/313 |
| 2015/0346245 A1* | 12/2015 | Kiep | ...................... | H02M 3/158 |
| | | | | 323/284 |
| 2017/0271867 A1* | 9/2017 | Hamada | ................... | H02M 1/32 |
| 2018/0081422 A1* | 3/2018 | Chang | ................... | G06F 1/3296 |
| 2019/0310677 A1* | 10/2019 | Terasaki | ................... | H03K 5/24 |

FOREIGN PATENT DOCUMENTS

| | | | | |
|---|---|---|---|---|
| EP | 3484035 A1 * | 5/2019 | ............ | H02H 1/066 |
| TW | 201120606 A | 6/2011 | | |

* cited by examiner

HYSTERESIS VOLTAGE DETECTION CIRCUIT

BACKGROUND

Technical Field

The present disclosure relates to a voltage detection circuit, and more particularly to a hysteresis voltage detection circuit that detects voltage changes to control voltage hysteresis.

Description of Related Art

The statements in this section merely provide background information related to the present disclosure and do not necessarily constitute prior art.

In the conventional circuit implementation, generally, the comparator with a positive feedback function is used to achieve the voltage hysteresis. Furthermore, the conventional voltage hysteresis can adjust a reference voltage through power switches and produce hysteresis voltage function by using a comparator. In the prior art, a BJT (bipolar junction transistor) used together with the comparator is susceptible to severe voltage level drift due to process tolerances or changes in environmental temperature. When a circuit is used for transient point detection (such as temperature protection, avoiding noise interference, avoiding malfunction, etc.), the accuracy of an operating point corresponding to the voltage hysteresis corresponding to the BJT is not enough, resulting a problem with inability to accurately control the voltage hysteresis. Further, the comparator used in the prior art has disadvantages of higher cost, higher power consumption, and complicated circuit design.

Therefore, how to design a hysteresis voltage detection circuit, in particular to solve the aforementioned technical problems of the prior art, is an important subject studied by the inventor of the present disclosure.

SUMMARY

A purpose of the present disclosure is to provide a hysteresis voltage detection circuit, which solves the problem that circuit in prior art is susceptible to the process tolerance or changes in environmental temperature when the transient point detection is used, and solves the problem that serious voltage level drift caused by as mentioned. To achieve the purpose of low cost, low power consumption and accurate control of voltage hysteresis.

In order to achieve the purpose as mentioned, the hysteresis voltage detection circuit includes a voltage stabilizing unit, a first power switch circuit, and a second power switch circuit. The voltage stabilizing unit having an anode, a cathode and a reference terminal, wherein the anode is grounded, and the cathode is coupled to an adjustable voltage source. The first power switch circuit including a first power switch, wherein the first power switch is coupled to the cathode of the voltage stabilizing unit and the adjustable voltage source. The second power switch circuit including a first voltage dividing resistor, a second voltage dividing resistor, a third voltage dividing resistor, and a second power switch, wherein the second power switch is a field effect transistor, and the reference terminal of the voltage stabilizing unit is coupled to the adjustable voltage source through the first voltage dividing resistor, the second voltage dividing resistor and the third voltage dividing resistor are coupled to the second power switch, the second voltage dividing resistor is grounded, the second power switch is coupled to the first power switch, and the second power switch is coupled to the first voltage dividing resistor and the reference terminal of the voltage stabilizing unit through the second voltage dividing resistor and the third voltage dividing resistor. When both the first power switch and the second power switch are turned on, the first voltage dividing resistor, the second voltage dividing resistor, and the third voltage dividing resistor divide the adjustable voltage source, and a first voltage is generated to the reference terminal of the voltage stabilizing unit to turn on the voltage stabilizing unit. When both the first power switch and the second power switch are turned off, the first voltage dividing resistor and the second voltage dividing resistor divide the adjustable voltage source, and a second voltage is generated to the reference terminal of the voltage stabilizing unit to turn off the voltage stabilizing unit.

Further, the cathode of the voltage stabilizing unit is coupled to the adjustable voltage source through a first current limiting resistor.

Further, the first power switch circuit further includes a diode and a second current limiting resistor. The second current limiting resistor coupled to the diode, the first power switch is coupled to the first current limiting resistor and the voltage stabilizing unit through the second current limiting resistor and the diode.

Further, the first power switch is grounded through a third current limiting resistor.

Further, the third current limiting resistor is grounded through a Zener diode.

Further, the first voltage is less than the second voltage.

Further, the adjustable voltage source includes a mains or a sine wave generator.

Further, the adjustable voltage source includes a thermistor.

When using the hysteresis voltage detection circuit of the present disclosure, since voltage level of the adjustable voltage source is variable, according to the first voltage dividing resistor, the second voltage dividing resistor and the third voltage dividing resistor can control a hysteresis entry point a hysteresis exit point. When the voltage level of the adjustable voltage source is adjusted so that both the first power switch and the second power switch are turned on, the first voltage dividing resistor, the second voltage dividing resistor, and the third voltage dividing resistor divide the adjustable voltage source, and generate the first voltage to the reference terminal of the voltage stabilizing unit to turn on the voltage stabilizing unit. At this time, the hysteresis voltage detection circuit is located at the hysteresis entry point. When the voltage level of the adjustable voltage source is adjusted to turn off both the first power switch and the second power switch, the first voltage dividing resistor and the second voltage dividing resistor divide the adjustable voltage source, and generate a second voltage to the reference terminal of the voltage stabilizing unit to turn off the voltage stabilizing unit. At this time, the hysteresis voltage detection circuit is located at the hysteresis exit point. Further, the second power switch of the hysteresis voltage detection circuit which below the voltage dividing resistors is a FET (field effect transistor). FETs has better temperature stability than BJTs used in prior art voltage hysteresis circuits, and the on-resistance of FETs is less susceptible to changes in environmental temperature and has no serious voltage level drift. Configuring FETs with voltage dividing resistors reduces the effect of temperature on voltage level drift. Compared with prior art method, the present disclosure also avoids the disadvantages such as higher cost, higher power consumption, and corresponding circuit complexity caused by using the comparator.

For this reason, the hysteresis voltage detection circuit solves the problem that circuit in prior art is susceptible to the process tolerance or changes in environmental temperature when the transient point detection is used, and solves the problem that serious voltage level drift caused by as mentioned. To achieve the purpose of low cost, low power consumption and accurate control of voltage hysteresis.

In order to further understand the techniques, means, and effects of the present disclosure for achieving the intended purpose. Please refer to the following detailed description and drawings of the present disclosure. The drawings are provided for reference and description only, and are not intended to limit the present disclosure.

DETAILED DESCRIPTION

Figure 1:
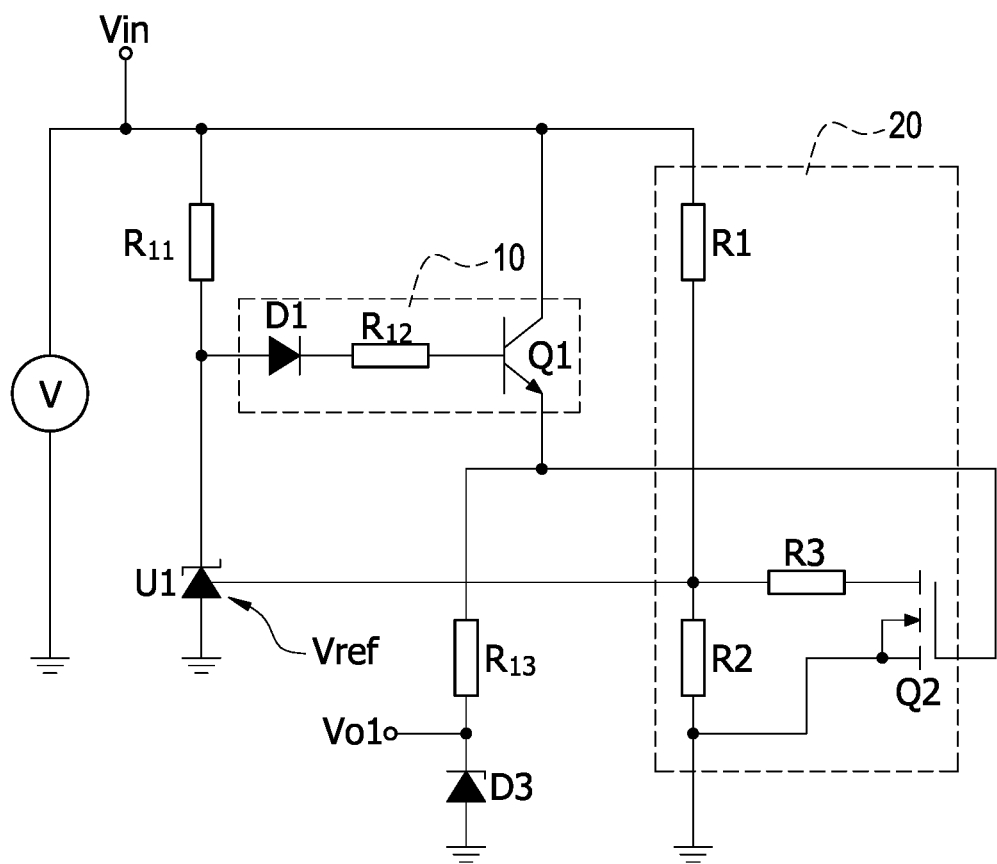
FIG. 1 is a circuit architecture diagram of a hysteresis voltage detection circuit of the present disclosure.

The embodiments of the present disclosure are described by way of specific examples, and those skilled in the art can readily appreciate the other advantages and functions of the present disclosure. The present disclosure may be embodied or applied in various other specific embodiments, and various modifications and changes can be made without departing from the spirit and scope of the present disclosure.

It should be understood that the structures, the proportions, the sizes, the number of components, and the like in the drawings are only used to cope with the contents disclosed in the specification for understanding and reading by those skilled in the art, and it is not intended to limit the conditions that can be implemented in the present disclosure, and thus is not technically significant. Any modification of the structure, the change of the proportional relationship, or the adjustment of the size, should be within the scope of the technical contents disclosed by the present disclosure without affecting the effects and the achievable effects of the present disclosure.

The technical content and detailed description of the present disclosure will be described below in conjunction with the drawings.

Figure 2:
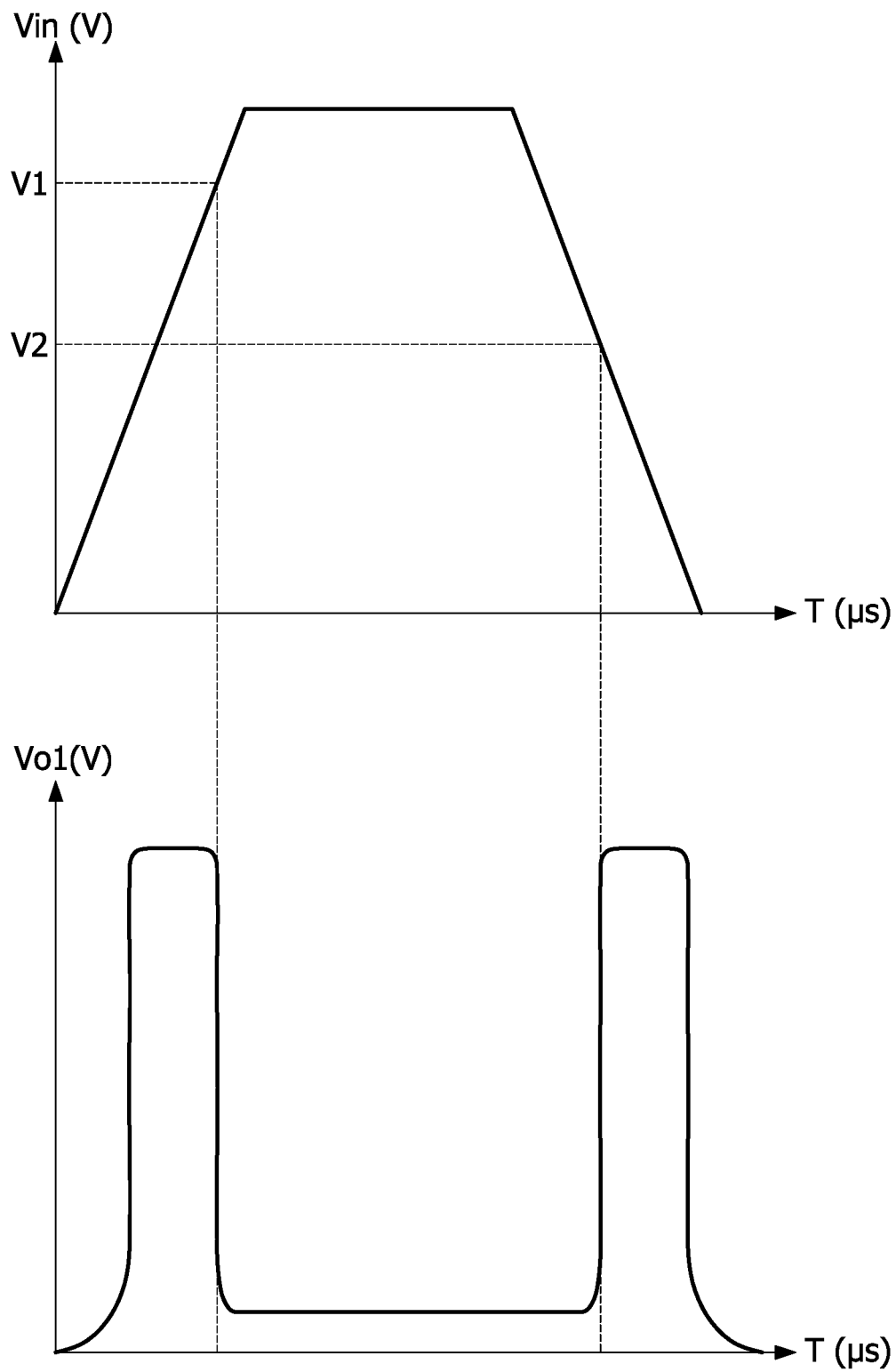
FIG. 2 and FIG. 3 are waveform diagrams of hysteresis phenomena of the hysteresis voltage detection circuit of the present disclosure.
Figure 3:
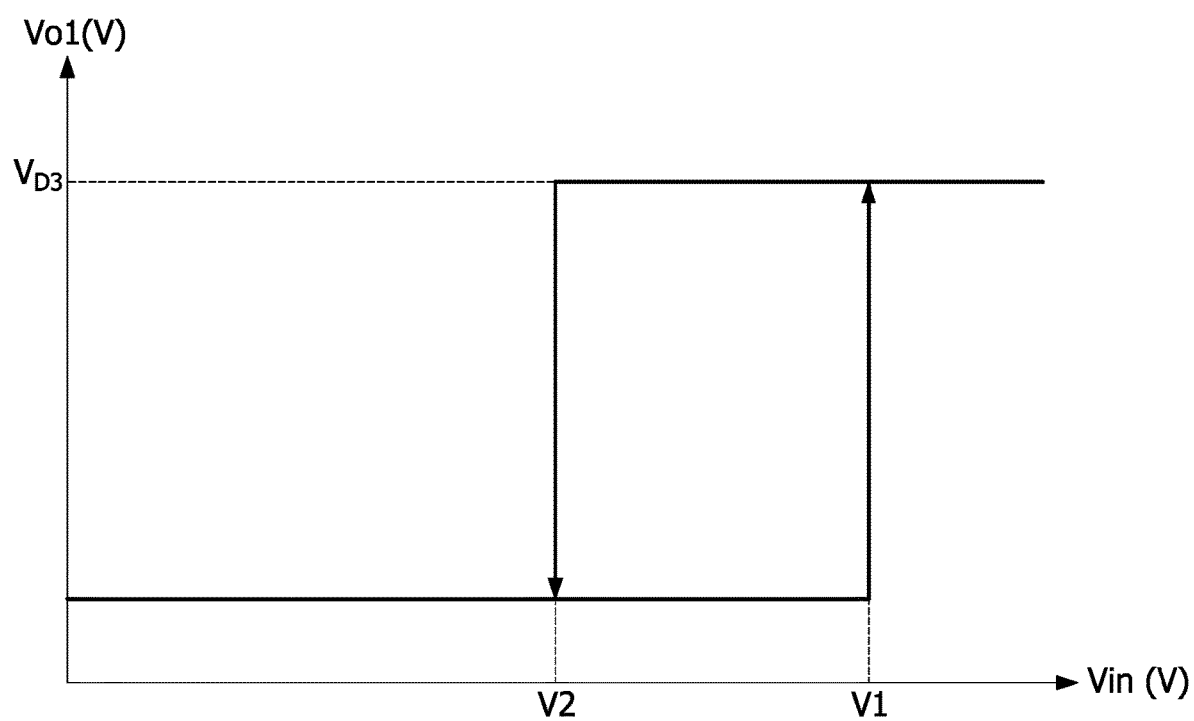

Please refer to FIG. 1 to FIG. 3. FIG. 1 is a circuit architecture diagram of a hysteresis voltage detection circuit of the present disclosure. FIG. 2 and FIG. 3 are waveform diagrams of hysteresis phenomena of the hysteresis voltage detection circuit of the present disclosure.

In one embodiment of the present disclosure, the hysteresis voltage detection circuit includes a voltage stabilizing unit U1, a first power switch circuit 10, and a second power switch circuit 20. The voltage stabilizing unit U1 includes an anode, a cathode, and a reference terminal $V_{ref}$. The anode of the voltage stabilizing unit U1 is grounded. The cathode of the voltage stabilizing unit U1 is coupled to an adjustable voltage source V through a first current limiting resistor $R_{11}$. Further, the voltage stabilizing unit U1 may be an adjustable shunt regulator TL431 made by Texas Instruments (TI), but the present disclosure not limited thereto. A voltage measurement point $V_{in}$ is provided between the first current limiting resistor $R_{11}$ and the adjustable voltage source V. Further, the adjustable voltage source V may be a mains or a sine wave generator that can generate a variable voltage level, or may be a detection circuit including an NTC (negative temperature coefficient) component such as a thermistor.

The first power switch circuit 10 includes a first power switch Q1, a diode D1, and a second current limiting resistor $R_{12}$. In the embodiment of the present disclosure, two ends of the second current limiting resistor $R_{12}$ are respectively coupled to the diode D1 and the first power switch Q1. The diode D1 is coupled to the first current limiting resistor $R_{11}$ and the voltage stabilizing unit U1. The present disclosure is not limited thereto, however, as long as the diode D1 and the second current limiting resistor $R_{12}$ are coupled in series. In different embodiments of the present disclosure, two ends of the diode D1 are respectively coupled to the second current limiting resistor $R_{12}$ and the first power switch Q1. The second current limiting resistor $R_{12}$ is coupled to the first current limiting resistor $R_{11}$ and the voltage stabilizing unit U1. The first power switch Q1 may be an N-P-N type BJT (bipolar junction transistor), and a collector of the first power switch Q1 is coupled to the adjustable voltage source V and the first current limiting resistor $R_{11}$. A base of the first power switch Q1 is coupled to the first current limiting resistor $R_{11}$ and the voltage stabilizing unit U1 through the second current limiting resistor $R_{12}$ and the diode D1 sequentially. An emitter of the first power switch Q1 is coupled to the third current limiting resistor $R_{13}$, and is grounded through the third current limiting resistor $R_{13}$ and the Zener diode D3 sequentially. There is a voltage measurement point $V_{o1}$ between the third current limiting resistor $R_{13}$ and the Zener diode D3. In another embodiment (not shown) of the present disclosure, the Zener diode D3 may not be required. That is, the emitter of the first power switch Q1 is grounded only through the third current limiting resistor $R_{13}$. However, this disclosure is not limited thereto.

The second power switch circuit 20 includes a first voltage dividing resistor R1, a second voltage dividing resistor R2, a third voltage dividing resistor R3, and a second power switch Q2. The second power switch Q2 may be an N-type MOSFET (metal-oxide-semiconductor field effect transistor), but the present disclosure is not limited thereto. The reference terminal $V_{ref}$ of the voltage stabilizing unit U1 is coupled to the adjustable voltage source V through the first voltage dividing resistor R1. One end of the second voltage dividing resistor R2 is coupled to a source of the second power switch Q2, and the other end of the second voltage dividing resistor R2 is grounded. One end of the third voltage dividing resistor R3 is coupled to the second voltage dividing resistor R2, and the other end of the third voltage dividing resistor R3 is coupled to a drain of the second power switch Q2. A gate of the second power switch Q2 is coupled to the emitter of the first power switch Q1, and the second power switch Q2 is coupled to the first voltage dividing resistor R1 and the reference terminal $V_{ref}$ of the voltage stabilizing unit U1 through the second voltage dividing resistor R2 and the third voltage dividing resistor R3.

When using the hysteresis voltage detection circuit of the present disclosure, since voltage level of the adjustable voltage source V is variable (or adjustable), a hysteresis entry point and a hysteresis exit point can be controlled according to the first voltage dividing resistor R1, the second voltage dividing resistor R2 and the third voltage dividing resistor R3. When the voltage level of the adjustable voltage source V is adjusted so that both the first power switch Q1 and the second power switch Q2 are turned on, the first voltage dividing resistor R1, the second voltage dividing resistor R2, and the third voltage dividing resistor R3 divide the adjustable voltage source V. In this condition, the second voltage dividing resistor R2 and the third voltage dividing resistor R3 are connected in parallel, and then connected in series with the first voltage dividing resistor R1, to generate a first voltage $V_{ref-1}$ to the reference terminal $V_{ref}$ of the voltage stabilizing unit U1 to turn on the voltage stabilizing unit U1 (assuming that a turn-on threshold voltage of TL431 is 2.5V). At this time, the hysteresis voltage detection circuit operates in a state of the hysteresis entry point. Further, when the hysteresis voltage detection circuit operates in the state of the hysteresis entry point, the voltage measured by the voltage measurement point $V_{in}$ is V1 (in the embodiment of the present disclosure, the voltage V1 may be 14V). The voltage waveform at the voltage measurement point $V_{o1}$ also changes accordingly with a time axis T (unit is microsecond, μs), as shown in FIG. 2. Because the first power switch Q1 is tuned on when the voltage measured at the voltage measurement point $V_{in}$ is V1, the voltage measured at the voltage measurement point $V_{o1}$ is same as the voltage $V_{D3}$ of the Zener diode D3, as shown in FIG. 3.

Further, the value of the voltage V1 can be calculated by the following equation:

$$V1 = \frac{R1 + \left(\frac{R2 \times R3}{R2 + R3}\right)}{\left(\frac{R2 \times R3}{R2 + R3}\right)} \times 2.5 = \frac{R1(R2 + R3) + (R2 \times R3)}{(R2 \times R3)} \times 2.5$$

And, the value of the first voltage $V_{ref-1}$ can be calculated by the following equation:

$$V_{ref-1} = \frac{\left(\frac{R2 \times R3}{R2 + R3}\right)}{R1 + \left(\frac{R2 \times R3}{R2 + R3}\right)} \times V1 = \frac{(R2 \times R3)}{R1(R2 + R3) + (R2 \times R3)} \times V1$$

When the voltage level of the adjustable voltage source V is adjusted to turn off both the first power switch Q1 and the second power switch Q2, the first voltage dividing resistor R1 and the second voltage dividing resistor R2 divide the adjustable voltage source V. In this condition, the first voltage dividing resistor R1 and the second voltage dividing resistor R2 are connected in series, to generate a second voltage $V_{ref-2}$ to the reference terminal $V_{ref}$ of the voltage stabilizing unit U1 to turn off the voltage stabilizing unit U1. At this time, the hysteresis voltage detection circuit operates in a state of the hysteresis exit point. In the embodiment of the present disclosure, the first voltage $V_{ref-1}$ is smaller than the second voltage $V_{ref-2}$. Further, when the hysteresis voltage detection circuit operates in the state of the hysteresis exit point, the voltage measured by the voltage measurement point $V_{in}$ is V2 (in the embodiment of the present disclosure, the voltage V2 may be 10V). The voltage waveform at the voltage measurement point $V_{o1}$ also changes accordingly with the time axis T (unit is microsecond, μs), as shown in FIG. 2. Further, the second power switch Q2 of the hysteresis voltage detection circuit is an FET (field effect transistor). FETs have better temperature stability than BJTs used in prior art voltage hysteresis circuits, and the on-resistance of FETs is less susceptible to change in environmental temperature and have no serious voltage level drift. Configuring FETs with the first voltage dividing resistor R1, the second voltage dividing resistor R2, and the third voltage dividing resistor R3 reduces the effect of temperature on voltage level drift. Compared with prior art method, the present disclosure also avoids the disadvantages of higher cost, higher power consumption, and complicated circuit design caused by using the comparator.

Further, the value of the voltage V2 can be calculated by the following equation:

$$V2 = \frac{R1 + R2}{R2} \times 2.5$$

And, the value of the second voltage $V_{ref-2}$ can be calculated by the following equation:

$$V_{ref-2} = \frac{R2}{R1 + R2} \times V2$$

For this reason, the hysteresis voltage detection circuit solves the problem that circuit in prior art is susceptible to the process tolerance or changes in environmental temperature when the transient point detection is used, and solves the problem that serious voltage level drift caused by as mentioned. To achieve the purpose of low cost, low power consumption and accurate control of voltage hysteresis.

The above is only a detailed description and drawings of the preferred embodiments of the present disclosure, but the features of the present disclosure are not limited thereto, and are not intended to limit the present disclosure. All the scope of the present disclosure shall be subject to the scope of the following claims. The embodiments of the spirit of the present disclosure and its similar variations are intended to be included in the scope of the present disclosure. Any variation or modification that can be easily conceived by those skilled in the art in the field of the present disclosure can be covered by the following claims.

What is claimed is:

1. A hysteresis voltage detection circuit comprising:
   a voltage stabilizing unit having an anode, a cathode and a reference terminal, wherein the anode is grounded and the cathode is coupled to an adjustable voltage source,
   a first power switch circuit comprising a first power switch, wherein the first power switch is coupled to the cathode of the voltage stabilizing unit and the adjustable voltage source, and
   a second power switch circuit comprising a first voltage dividing resistor, a second voltage dividing resistor, a third voltage dividing resistor, and a second power switch, wherein the second power switch is a field effect transistor, and the reference terminal of the voltage stabilizing unit is coupled to the adjustable voltage source through the first voltage dividing resistor, the second voltage dividing resistor and the third voltage dividing resistor are coupled to the second power switch, the second voltage dividing resistor is grounded, the second power switch is coupled to the first power switch, and the second power switch is coupled to the first voltage dividing resistor and the reference terminal of the voltage stabilizing unit through the second voltage dividing resistor and the third voltage dividing resistor,
   wherein, when both the first power switch and the second power switch are turned on, the first voltage dividing resistor, the second voltage dividing resistor, and the third voltage dividing resistor divide the adjustable voltage source, and a first voltage is generated to the reference terminal of the voltage stabilizing unit to turn on the voltage stabilizing unit, wherein, when both the first power switch and the second power switch are turned off, the first voltage dividing resistor and the second voltage dividing resistor divide the adjustable voltage source, and a second voltage is generated to the reference terminal of the voltage stabilizing unit to turn off the voltage stabilizing unit, wherein, the first power switch is a bipolar transistor (BJT) comprising an emitter, the emitter of the first power switch is coupled to a third current limiting resistor, and the emitter is directly grounded only through the third current limiting resistor and a Zener diode in sequence.

2. The hysteresis voltage detection circuit in claim 1, wherein the cathode of the voltage stabilizing unit is coupled to the adjustable voltage source through a first current limiting resistor.

3. The hysteresis voltage detection circuit in claim 2, wherein the first power switch circuit further comprises:

a diode, and a second current limiting resistor coupled to the diode, wherein, the first power switch is coupled to the first current limiting resistor and the voltage stabilizing unit through the second current limiting resistor and the diode.

4. The hysteresis voltage detection circuit in claim 1, wherein the first voltage is less than the second voltage.

5. The hysteresis voltage detection circuit in claim 1, wherein the adjustable voltage source comprises a mains or a sine wave generator.

6. The hysteresis voltage detection circuit in claim 1, wherein the adjustable voltage source comprises a thermistor.

* * * * *